US 11,149,589 B2

United States Patent
Yashirodai et al.

(10) Patent No.: US 11,149,589 B2
(45) Date of Patent: Oct. 19, 2021

(54) TURBINE ASSEMBLY SUPPORT PROGRAM, TURBINE ASSEMBLY SUPPORT SYSTEM, AND TURBINE ASSEMBLY METHOD USING CORRECTED FINITE ELEMENT MODEL

(71) Applicant: Mitsubishi Power, Ltd., Yokohama (JP)

(72) Inventors: Kenji Yashirodai, Tokyo (JP); Shunsuke Mizumi, Tokyo (JP); Koji Ishibashi, Yokohama (JP); Jie Huang, Tokyo (JP); Juichi Kodera, Yokohama (JP)

(73) Assignee: Mitsubishi Power, Ltd., Yokohama (JP)

( * ) Notice: Subject to any disclaimer, the term of this patent is extended or adjusted under 35 U.S.C. 154(b) by 69 days.

(21) Appl. No.: 16/150,423

(22) Filed: Oct. 3, 2018

(65) Prior Publication Data
US 2019/0107007 A1  Apr. 11, 2019

(30) Foreign Application Priority Data

Oct. 6, 2017  (JP) .............................. JP2017-196016

(51) Int. Cl.
*G06F 30/17* (2020.01)
*G06F 30/23* (2020.01)
(Continued)

(52) U.S. Cl.
CPC ......... *F01D 25/243* (2013.01); *F01D 21/003* (2013.01); *F01D 25/26* (2013.01);
(Continued)

(58) Field of Classification Search
CPC ...... F01D 25/243; F01D 25/26; F01D 21/003; F01D 25/24; G06F 30/17; G06F 30/23;
(Continued)

(56) References Cited

U.S. PATENT DOCUMENTS 5,627,761 A * 5/1997 Pollard ..................... G01B 7/14
324/207.22
6,257,829 B1 * 7/2001 Seeley ..................... F01D 25/00
248/555

(Continued)

FOREIGN PATENT DOCUMENTS

CN 108733889 A 11/2018
JP 3-67002 A 3/1991
(Continued)

OTHER PUBLICATIONS

Korean-language Office Action issued in counterpart Korean Application No. 10-2018-0115833 dated Nov. 29, 2019 with English translation (eight (8) pages).
(Continued)

*Primary Examiner* — Kenneth M Lo
*Assistant Examiner* — Jonathan Michael Skrzycki
(74) *Attorney, Agent, or Firm* — Crowell & Moring LLP

(57) ABSTRACT

In assembling a turbine including: a casing consisting of an upper half part and a lower half part fastened together by bolts; a stationary body accommodated in the casing and supported by the lower half part; and a rotary body supported by a plurality of bearings so as to be situated on the inner side of the stationary body, there are executed: a procedure of reading a finite element model of the three-dimensional configuration of the turbine; a reading procedure of reading actual measurement information on the three-dimensional configuration of the upper half part and the lower half part of the casing in the open state; a model correction procedure of reflecting actual measurement information of an evaluated portion that is a specific part of the casing in the finite element model and generating a correction model obtained through correction of the finite element model; a deformation amount estimation procedure of estimating the movement amount of the evaluated portion
(Continued)

generated when the upper half part and the lower half part of the casing are fastened together by the bolts through simulation using the correction model; and an output procedure of outputting an estimated value of the movement amount to an output device.

8 Claims, 8 Drawing Sheets

(51) Int. Cl.
*F01D 25/24* (2006.01)
*F01D 25/26* (2006.01)
*F01D 21/00* (2006.01)
*G01B 21/24* (2006.01)

(52) U.S. Cl.
CPC .............. *G06F 30/17* (2020.01); *G06F 30/23* (2020.01); *F05D 2220/31* (2013.01); *F05D 2230/60* (2013.01); *F05D 2230/64* (2013.01); *F05D 2230/80* (2013.01); *F05D 2260/81* (2013.01); *F05D 2260/821* (2013.01); *G01B 21/24* (2013.01)

(58) Field of Classification Search
CPC ............. F05D 2260/81; F05D 2230/80; F05D 2230/60; F05D 2220/31; F05D 2260/821; F05D 2230/64; G01B 21/24
See application file for complete search history.

(56) References Cited

U.S. PATENT DOCUMENTS

| | | | |
|---|---|---|---|
| 2002/0082726 | A1 | 6/2002 | Steingraeber |
| 2010/0027861 | A1* | 2/2010 | Shekhar ............... G06T 7/12 382/131 |
| 2018/0307205 | A1 | 10/2018 | Yashirodai et al. |

FOREIGN PATENT DOCUMENTS

| | | |
|---|---|---|
| JP | 2007-32504 A | 2/2007 |
| JP | 2011-89458 A | 5/2011 |
| JP | 2014-231798 A | 12/2014 |
| WO | WO 2012/001852 A1 | 1/2012 |

OTHER PUBLICATIONS

Extended European Search Report issued in counterpart European Application No. 18198781.9 dated Mar. 1, 2019 (eight (8) pages).
Korean-language Office Action issued in Korean Application No. 10-2018-0115833 dated May 29, 2020 with English translation (nine pages).
Chinese-language Office Action issued in Chinese Application No. 201811151128.2 dated Feb. 2, 2021 (seven (7) pages).

* cited by examiner

TURBINE ASSEMBLY SUPPORT PROGRAM, TURBINE ASSEMBLY SUPPORT SYSTEM, AND TURBINE ASSEMBLY METHOD USING CORRECTED FINITE ELEMENT MODEL

BACKGROUND OF THE INVENTION

1. Field of the Invention

The present invention relates to a turbine assembly support program, a turbine assembly support system, and a turbine assembly method.

2. Description of the Related Art

Generally speaking, the casing of a turbine is divided into upper and lower half parts, with flanges of the upper and lower half parts being fastened together by bolts. Accommodated in the casing is a stationary body including a stator vane and a rotary body including a rotor blade. There is a gap between the rotary body and the stationary body. To improve the turbine performance, it is desirable for this gap to be as small as possible.

In the state in which the upper and lower half parts of the casing are not fastened together by the bolts, they slightly bend due to their own weight. When they are fastened together by bolts, the mutual flange surfaces often tend to rise as a whole. When the turbine is assembled without taking this into consideration, the stationary body rises together with the casing with respect to the rotary body, and the gap between the stationary body and the rotary body is diminished on the lower half part side, and, in extreme cases, the stationary body comes into contact with the rotary body. In view of this, the turbine assembly work involves a number of processes for strictly controlling the gap between the stationary body and the rotary body (see JP-1991-67002-A and JP-2007-32504-A).

SUMMARY OF THE INVENTION

The displacement amount of the flange surfaces of the upper half part and the lower half part of the casing is checked through measurement after the actual temporary assembly of the upper half part and the lower half part. In the temporary assembly, thermal shrinking is performed as in the case of the final assembly. The thermal shrinking is a fastening method in which a nut is threadedly engaged with a bolt expanded through heating and in which the fastening force is increased by utilizing contraction of the bolt. Generally speaking, thermal shrinking requires the processes of heating and natural cooling the bolt. The number of bolts used for fastening the upper half part and the lower half part of the casing is large. Further, the bolts are large in size and are not easily cooled. Thus, the process of temporarily assembling the upper half part and the lower half part of the casing requires an enormous amount of labor and time, and, partly due to this temporary assembly process, long time is required for the turbine assembly work. Further, the actual casing involves variation in the deformation amount at the time of bolt fastening due to individual differences in configuration and material, and it is not always possible to secure the requisite accuracy by evaluation based on actual result data.

It is an object of the present invention to provide a turbine assembly support program, a turbine assembly support system, and a turbine assembly method allowing omission of the temporary casing assembly process and making it possible to assemble a turbine with high accuracy and in a short period of time.

To achieve the above object, there is provided, in accordance with the present invention, a method of assembling a turbine including: a casing having an upper half part and a lower half part fastened together by bolts; a stationary body including a plurality of stator vanes, accommodated in the casing, and of a vertically divided structure supported by the lower half part; and a rotary body including a plurality of rotor blades and supported by a plurality of bearings so as to be situated on an inner side of the stationary body, the method including the steps of: actually measuring a three-dimensional configuration of the upper half part and the lower half part of the casing in an open state; reflecting actual measurement information of an evaluated portion that is a specific part of the casing in a finite element model of the turbine; generating a correction model obtained through correction of the finite element model; estimating a movement amount of the evaluated portion, the movement amount being generated when the upper half part and the lower half part of the casing actually measured are fastened together by the bolts, through simulation using the correction model; installing a lower half part of the stationary body in the lower half part of the casing and adjusting a position of the lower half part of the stationary body based on an estimated value of the movement amount; and successively mounting the rotary body, an upper half part of the stationary body, and the upper half part of the casing.

Advantage of the Invention

According to the present invention, it is possible to calculate the deformation amount of the evaluated portion through analysis using a correction model reflecting actual measurement information of a real machine, so that it is possible to evaluate the position adjustment amount of the stationary body with high accuracy, making it possible to assemble a turbine with high accuracy. Further, the casing temporary assembly process is omitted, making it possible to assemble a turbine in a short period of time.

DESCRIPTION OF THE PREFERRED EMBODIMENT

In the following, an embodiment of the present invention will be described with reference to the drawings.

(Turbine)

Figure 1:
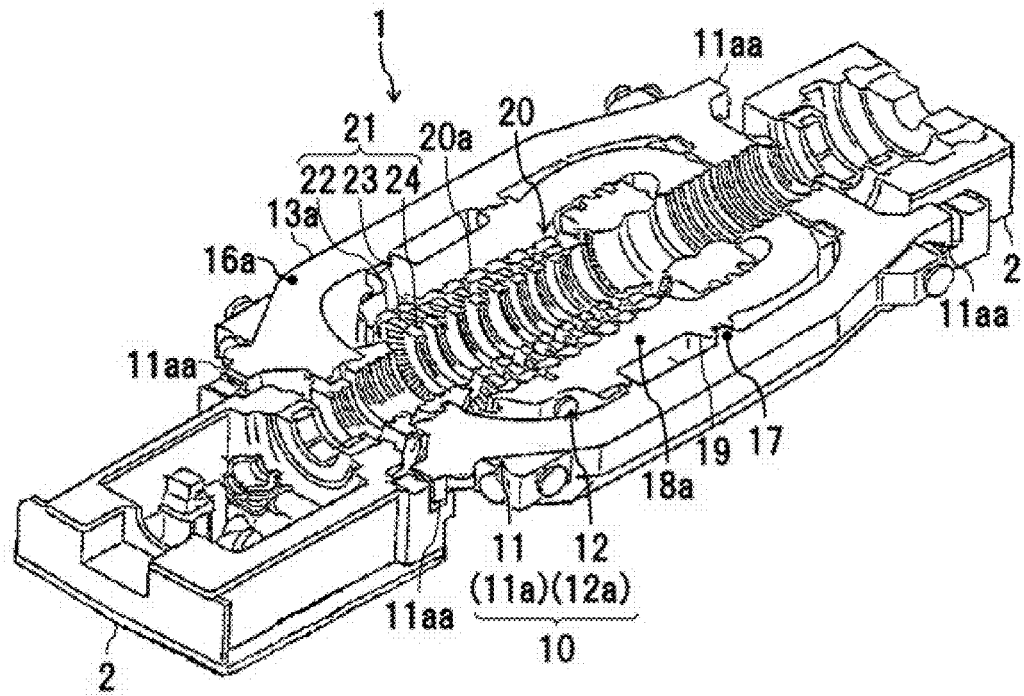
FIG. 1 is a perspective view illustrating a structure of a lower half part of a steam turbine constituting an application example of the present invention.
Figure 2:
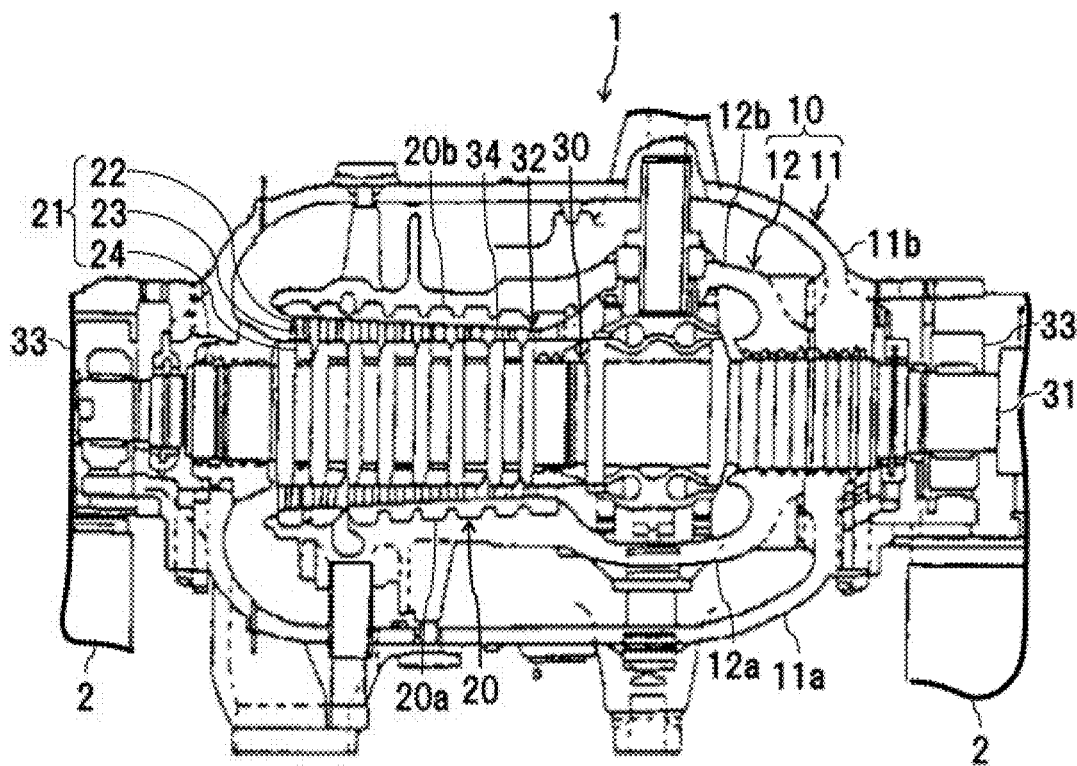
FIG. 2 is a sectional view of a complete assembly product of the steam turbine shown in FIG. 1 taken along a vertical plane including a turbine center axis.
Figure 3:
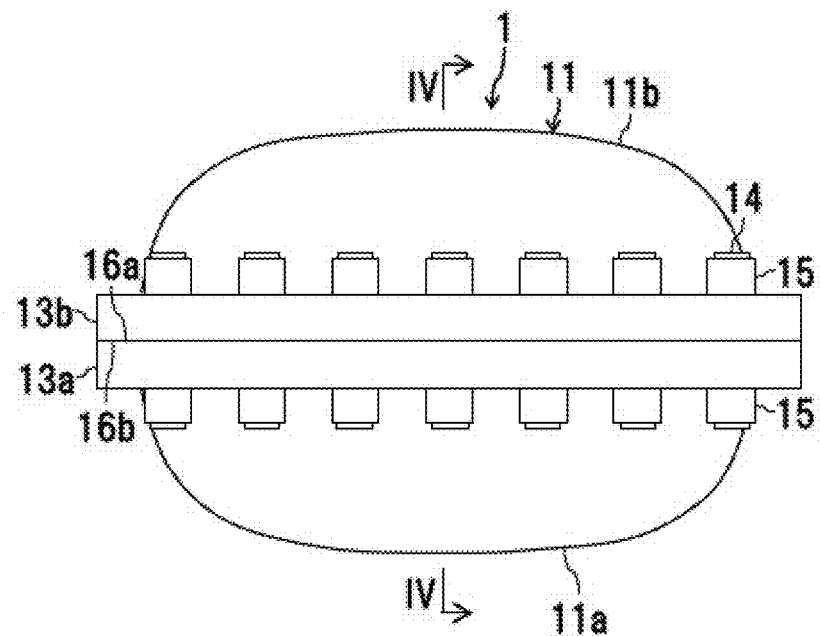
FIG. 3 is a schematic external side view illustrating the casing of the steam turbine shown in FIG. 2.
Figure 4:
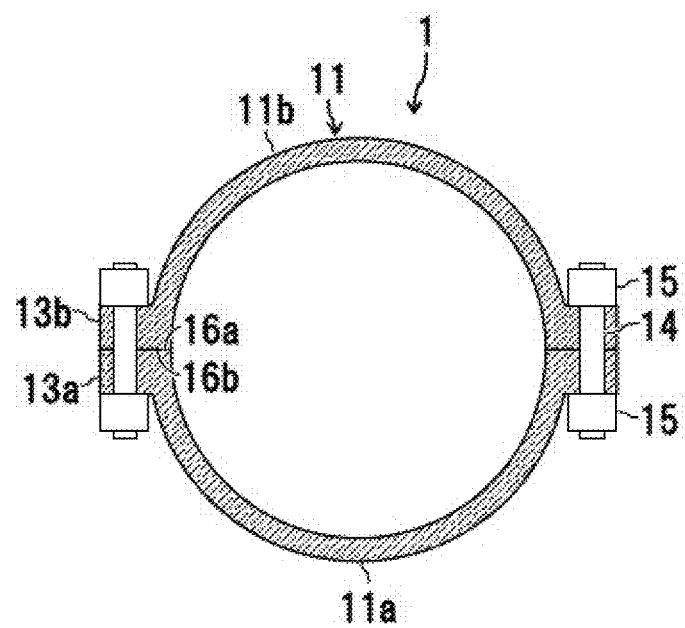
FIG. 4 is a sectional view taken along arrow line IV-IV of FIG. 3.

FIG. 1 is a perspective view illustrating a structure of a lower half part of a steam turbine constituting an application example of the present invention. FIG. 2 is a schematic sectional view of a complete assembly product of the steam turbine shown in FIG. 1 taken along a vertical plane including a turbine center axis, FIG. 3 is a schematic external side view illustrating the casing of the steam turbine shown in FIG. 2, and FIG. 4 is a sectional view taken along arrow line IV-IV of FIG. 3. While the present embodiment will be described as applied to a steam turbine, the present invention is also applicable to the assembly work of a gas turbine (including one-axis type and two-axis type). As the main components, a steam turbine 1 shown is equipped with a casing 10, a stationary body 20, and a rotary body 30 (FIG. 2).

(Casing)

The casing 10 is a casing covering the outer periphery of the stationary body 20 and the rotary body 30, and is of a double structure consisting of an outer casing 11 and an inner casing 12. The inner casing 12 is an inner contour covering the periphery of the stationary body 20 and the rotary body 30, and the outer casing 11 is an outer contour covering the periphery of the inner casing 12. Both the outer casing 11 and the inner casing 12 are of a vertically divided structure. In the following, the lower half part of the outer casing 11 will be referred to as an outer casing lower half part 11a, the upper half part of the outer casing 11 will be referred to as an outer casing upper half part 11b, the lower half part of the inner casing 12 will be referred to as an inner casing lower half part 12a, and the upper half part of the inner casing 12 will be referred to as an inner casing upper half part 12b. In this way, the casing 10 is composed of a lower half part consisting of the outer casing lower half part 11a and the inner casing lower half part 12a, and an upper half part consisting of the outer casing upper half part 11b and the inner casing upper half part 12b.

Both sides in the turbine axis direction of the outer casing lower half part 11a are supported by a foundation 2. Between a support structure portion 11aa of the outer casing lower half part 11a and the foundation 2, there is provided a position adjustment member such as a shim (not shown). Due to the position adjustment member, it is possible to adjust the height of the outer casing lower half part 11a with respect to the foundation 2. In their mutual opposing portions, the outer casing lower half part 11a and the outer casing upper half part 11b have thick-walled flanges 13a and 13b. The outer casing lower half part 11a and the outer casing upper half part 11b are bonded to each other by firmly fastening together the flanges 13a and 13b by a plurality of bolts 14 and nuts 15. Flange surfaces 16a and 16b which are contact surfaces opposing each other, of the flanges 13a and 13b extend in the horizontal direction. On the inner wall surface of the outer casing lower half part 11a, there are provided a plurality of support portions 17 (FIG. 1) at positions near the flange surface 16a. The support portions 17 are portions supporting the inner casing 12.

Also the inner casing lower half part 12a and the inner casing upper half part 12b have thick-walled flanges in the mutually opposing portions (solely the flange 18a of the inner casing lower half part 12a is shown in FIG. 1). The inner casing lower half part 12a and the inner casing upper half part 12b are bonded to each other by firmly fastening together the mutual flanges by a plurality of bolts and nuts (not shown). The flange surfaces (contact surfaces) of the inner casing lower half part 12a and the inner casing upper half part 12b extend in the horizontal direction. On the outer wall surface of the inner casing lower half part 12a, there are provided a plurality of protrusions 19 (FIG. 1) at positions near the flanges surface of the flange 18a. The support portions 17 receive the protrusions 19, whereby the inner casing 12 is supported by the outer casing 11. Between the support portions 17 and the protrusions 19, there are provided a position adjustment members such as shims (not shown). The height of the protrusions 19 with respect to the support portions 17 is adjusted by the position adjustment members, whereby it is possible to adjust in the height direction the position of the inner casing 12 in the outer casing 11.

(Stationary Body)

The stationary body 20 is an annular (tubular) member including a plurality of stator vanes 21 arranged at intervals in the turbine axial direction, and is accommodated in the inner casing 12. Further, the stationary body 20 is of a vertically divided structure consisting of a lower half part 20a and an upper half part 20b. The contact surfaces of the lower half part 20a and the upper half part 20b extend in the horizontal direction. The lower half part 20a and the upper half part 20b of the stationary body 20 are firmly fastened together by bolts and nuts (not shown). The support structure of the stationary body 20 is similar to the support structure of the inner casing 12, and is not shown in detail. A plurality of protrusions provided on the outer wall surface of the lower half part 20a are received by support portions provided on the inner peripheral portion of the inner casing lower half part 12a. Between the protrusions of the lower half part 20a of the stationary body 20 and the support portions on the inner casing lower half part 12a, there are provided position adjustment members such as shims, making it possible to adjust in the height direction the position of the stationary body 20 inside the inner casing 12.

Each stator vane 21 is equipped with a diaphragm outer ring 22, a plurality of nozzle blades 23, and a diaphragm inner ring 24. The outer peripheral portions of the plurality of nozzle blades 23 arranged annularly are connected together by the diaphragm outer ring 22, and the inner peripheral portion thereof are connected together by the diaphragm inner ring 24.

(Rotary Body)

The rotary body 30 (FIG. 2) is a turbine rotor situated on the inner side of the stationary body 20. The rotary body 30 includes a shaft 31 and a plurality of rotor blades 32. Both sides of the shaft 31 protrude from the casing 10, and are supported by bearings 33 with respect to the foundation 2. The rotor blades 32 are formed by a plurality of buckets 34 annularly arranged in the outer peripheral portion of the shaft 31, and a plurality of them are arranged at intervals in the turbine axial direction. The rotor blades 32 and the stator vanes 21 are arranged alternately in the turbine axial direction. In the gap between the rotary body 30 and the stationary body 20, there is provided a seal such as a labyrinth seal (not shown). The seal is provided on the rotary body 30 or on the stationary body 20 or on both of them.

(Turbine Assembly Support System)

Figure 5:
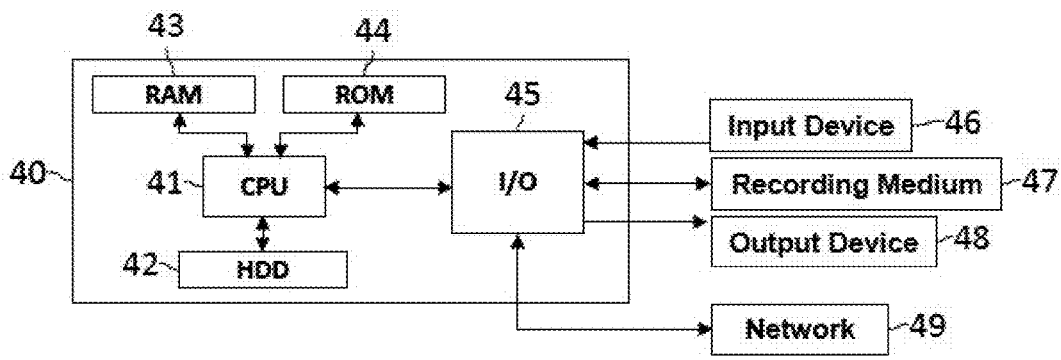
FIG. 5 is a schematic diagram illustrating a turbine assembly support system according to an embodiment of the present invention.

FIG. 5 is a schematic diagram illustrating a turbine assembly support system according to an embodiment of the present invention. The turbine assembly support system shown in FIG. 5 is a system supporting turbine assembly work, and a computer 40 is utilized. The computer 40 is equipped with a central processing unit (CPU) 41, a hard disk drive (HDD) 42, an random access memory (RAM) 43, a read only memory (ROM) (e.g., erasable programmable read only memory (EPROM)) 44, and an input/output (I/O) port 45.

Connected to the I/O port 45 as appropriate are an input device 46, a recording medium 47, an output device 48, a network 49, etc. As the input device 46, it is typically possible to use a keyboard, a mouse, a touch panel and the like. In the case where the output device 48 is a touch panel, the output device 48 also serves as the input device 46. As the recording medium 47, it is possible to employ various recording mediums such as a magnetic tape, a magnetic disk, an optical disk, a magneto-optical disk, or a semiconductor memory. As the output device 48, apart from a display device such as a monitor, a printer is also applicable. A device such as effecting sound output such as a speaker is also applicable as the output device 48. The computer 40 may be integrated with the input device 46 and the output device 48. There are no limitations regarding the type of the computer 40. It may be of a desktop type, a notebook type, or a tablet type. The network 49 includes not only the internet but also LAN or the like. The computer 40 can be connected to another terminal, a database, a server or the like via the network 49.

The ROM 44 stores various programs or the like including a turbine assembly support program. These programs are read from the ROM 44 by the CPU 41, and are loaded, for example, into the RAM 43 for execution. It is possible for the turbine assembly support program to be input from the recording medium 47 or the network 49 via the I/O port 45 and to be stored in the ROM 44. It is also possible to read the turbine assembly support program from the recording medium 47 or the network 49 by the CPU 41 via the I/O port 45, and load it directly into the RAM 43 for execution without storing it in the ROM 44. The data or the like obtained through the execution of the program is stored in one memory or more of the HDD 42, the ROM 44, the RAM 43, and the recording medium 47, and is output to the output device 48 through the operation of the input device 46. In the present specification, when used alone simply as "memory," the terms means at least one of the HDD 42, the ROM 44, the RAM 43, the recording medium 47, and the storage device or the like connected via the network 49.

(Turbine Assembly Support Program)

Figure 6:
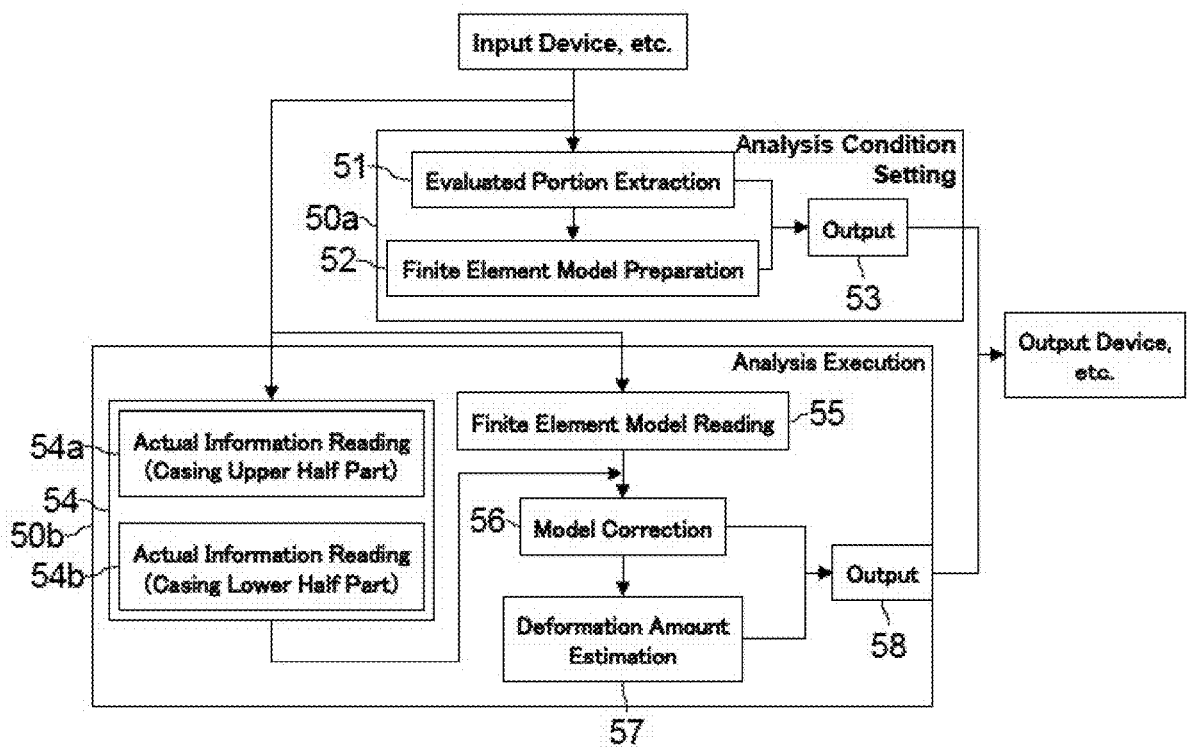
FIG. 6 is a conceptual drawing illustrating a turbine assembly support program according to an embodiment of the present invention.

FIG. 6 is a conceptual drawing illustrating a turbine assembly support program according to an embodiment of the present invention. The turbine assembly support program is a program supporting turbine assembly work. Roughly speaking, it includes, as the procedures to be executed by a computer (e.g., a computer 50), an analysis condition setting procedure 50a and an analysis execution procedure 50b. The analysis condition setting procedure 50a is a procedure of previously setting an analysis condition prior to the assembly of the turbine on the site. The analysis execution procedure 50b is a procedure of analyzing deformation of the turbine components with the assembly, and it is a procedure expected to be executed in parallel with the turbine assembly work, for example, on the turbine assembly site. The analysis condition setting procedure 50a and the analysis execution procedure 50b may be executed at different terminals. The analysis condition setting procedure 50a includes an evaluated portion extraction procedure 51, a finite element model preparation procedure 52, and an output procedure 53. The evaluated portion extraction procedure 51 and the finite element model preparation procedure 52 may be executed at different terminals. The analysis execution procedure 50b includes an actual measurement information reading procedure 54, a finite element model reading procedure 55, a model correction procedure 56, a deformation amount estimation procedure 57, and an output procedure 58. The model correction procedure 56 and the deformation amount estimation procedure 57 may be executed at different terminals. In the following, the procedures in the case where the above steam turbine 1 is the object of application will be described.

(Evaluated Portion Extraction Procedure)

Figure 7:
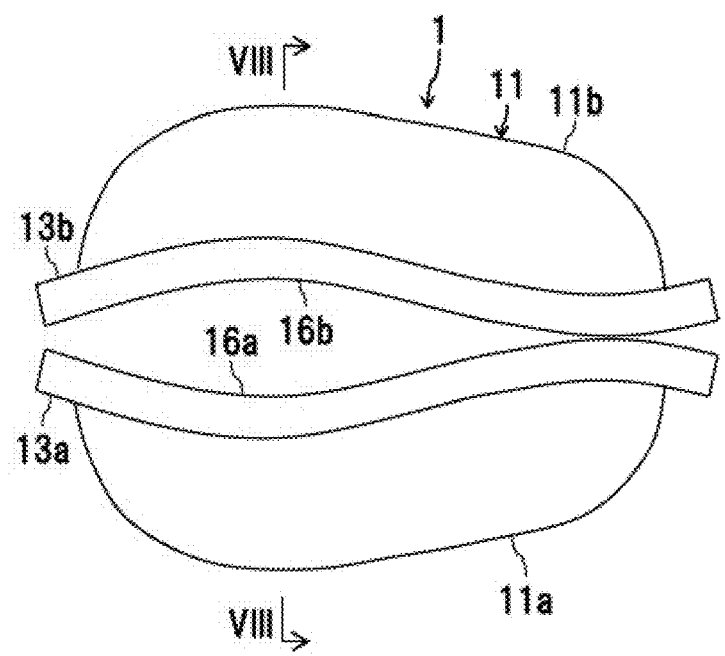
FIG. 7 is a side view schematically illustrating a casing deformed due to long-term operation of the steam turbine shown in FIG. 1.
Figure 8:
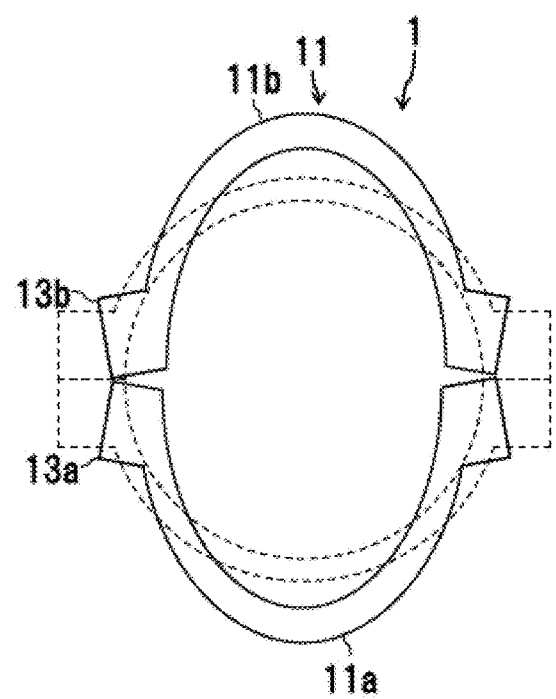
FIG. 8 is a sectional view taken along arrow line VIII-VIII of FIG. 7.

The evaluated portion extraction procedure 51 is a procedure of previously extracting as an evaluated portion a specific part of the casing 10 highly sensitive to deformation. As it is used, the casing 10 is exposed to high temperature working fluid, with the result that it undergoes a non-elastic deformation (mainly creep deformation) in which the flanges are undulated as shown in FIGS. 7 and 8. In FIGS. 7 and 8, the deformation is exaggerated. The evaluated portion is, for example, a portion greatly affecting the deformation and a portion corresponding to the position of the position adjustment member adjusting the position of the stationary body 20 with respect to the inner casing lower half part 12a. The extraction of the evaluated portion is effected, for example, by FE analysis (finite element analysis), the actual result data analysis, or a combination of these. The FE analysis is executed by using, for example, the design information (three-dimensional computer-aided design (CAD) data, material, and operating condition) of the steam turbine 1, the operation period, etc. as the basic information. Instead of the three-dimensional CAD data of the steam turbine 1, it is also possible to use the measurement information of the three-dimensional configuration of the steam turbine 1 measured by a three-dimensional measurement device or the like at the time of production. The analysis of the actual result data is executed by using, for example, the database of the actual result data obtained through the measurement of the casing configuration at the time of assembly/disassembly of a turbine of the same type or a type akin thereto as the basic information. The basic information is input from the memory contained in or connected to the computer executing the turbine assembly support program or from the input device 46. In the case where the analysis is performed by utilizing both the actual result data analysis and the FE analysis, it is advisable to employ a design planning method such as robust design in which the sensitivity is parametrically analyzed by using various configurations as the parameters. In the present embodiment described below, the flange surfaces 16a and 16b of the outer casing 11 are extracted as the evaluated portion. Apart from the flange surfaces 16a and 16b of the outer casing 11, typical examples of the evaluated portion include the flange surface of the inner casing 12, and the thick-walled portion of the outer peripheral wall of the outer casing 11 or the inner casing 12. In the case where the evaluated portion is restricted to a specific portion from the actual results, etc., it is not always necessary to execute the evaluated portion extraction procedure 51, and a specific portion may be set as the evaluated portion.

(Finite Element Model Preparation Procedure)

The finite element model preparation procedure 52 is a procedure of preparing a three-dimensional finite element model (FE model) of the steam turbine 1 used in the FE analysis of the casing deformation in the analysis execution procedure 50b. When, however, there is no need to newly prepare the FE model as in the case where an FE model of a separate turbine of the same model has been prepared in the past, it is not always necessary to execute the finite element model preparation procedure 52, and it is possible to employ the FE model prepared in the past. The FE model is, for example, a model of the steam turbine 1 formed by a plurality of meshes (solid) in which the length of one side (inter-apex distance) is set to be larger than the maximum assumed value (set value) of the movement amount of the evaluated portion at the time of bolt fastening (the final assembly process S22 of FIG. 13). The FE model is obtained, for example, by element-dividing into a plurality of meshes the design data (three-dimensional CAD data) of the object steam turbine 1 or the measurement information on the three-dimensional configuration of the actual turbine obtained through scanning or the like. Assuming, for example, that the maximum assumed value of the movement amount of the evaluated portion is approximately several mm, the length of one side of the mesh can be set to be approximately 30 mm. Since the dimension in the radial direction of the casing 10 is several hundred mm, and the dimension thereof in the axial direction is equal to or more than 3000 mm, this element division number provides a sufficient level of accuracy.

Figure 9:
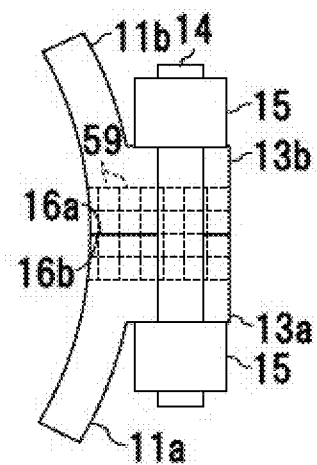
FIG. 9 is an enlarged view illustrating a portion around an evaluated portion of a finite element model of the turbine.

As shown in FIG. 9, in the present embodiment, the configuration of the mesh 59 is a cube (or a triangle pole) with horizontal upper and lower portions. The drawing solely shows the mesh 59 near the flange surfaces 16a and 16b of the outer casing lower half part 11a and the outer casing upper half part 11b. The mesh 59 is not restricted to one solely the apexes of which are nodal points. It may also be one having nodal points at and between the apexes. In the design, the flange surfaces 16a and 16b are horizontal surfaces, so that around this portion (the flanges 13a and 13b), layers in which the meshes 59 are arranged in the horizontal direction are vertically stacked together, resulting in an element division structure. The FE model is prepared, for example, as information including the three-dimensional coordinate data of the nodal points of the meshes, the material, etc. A similar method is applicable to the flange surfaces of the inner casing 12, the thick-walled portion of the outer peripheral wall of the outer casing 11 or the inner casing 12, etc.

(Output Procedure)

The output procedure 53 is a procedure by which the information on the evaluated portion extracted by the evaluated portion extraction procedure 51 and the FE model prepared by the finite element model preparation procedure 52 are output (recorded) to the memory or output to the output device 48. The operator can check information on the FE model and the evaluated portion through, for example, a monitor.

(Actual Measurement Information Reading Procedure)

The actual measurement information reading procedure 54 is a procedure for reading from the memory the actual measurement information on the three-dimensional configuration of the casing 10 in the open state. The actual measurement information on the three-dimensional configuration of the casing 10 is, for example, data obtained through reading by three-dimensional scanning the lower half part and the upper half part when the outer casing 11 is opened. The procedure for reading the actual measurement information of the lower half part (the outer casing lower half part 11a and the inner casing lower half part 12a) is the actual measurement information reading procedure 54a. The procedure for reading the actual measurement information of the upper half part (the outer casing upper half part 11b and the inner casing upper half part 12b) is the actual measurement information reading procedure 54b.

(Finite Element Model Reading Procedure)

The finite element model reading procedure 55 is the procedure for reading the FE model of the three-dimensional configuration of the upper half part and the lower half part of the casing 10 from the memory and loading it, for example, into the RAM 43. The FE model is prepared by the finite element model preparation procedure 52. What is read may be the FE model of the steam turbine 1 as a whole or the FE model of the evaluated portion alone.

(Model Correction Procedure)

Figure 10:
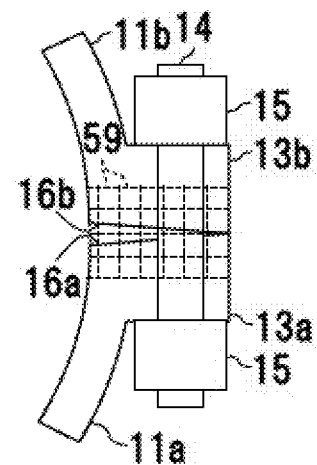
FIG. 10 is an enlarged view illustrating a portion around an evaluated portion of a correction model of the turbine.
Figure 11:
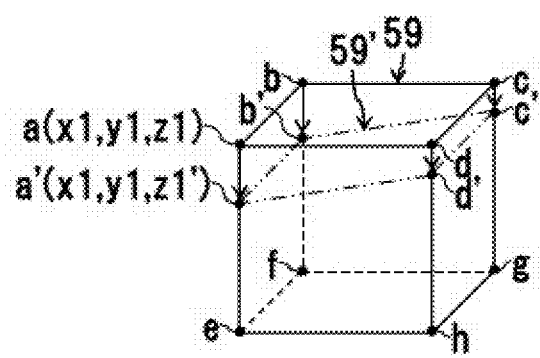
FIG. 11 is a diagram illustrating a correction concept of a mesh constituting a finite element model of the turbine.
Figure 12:
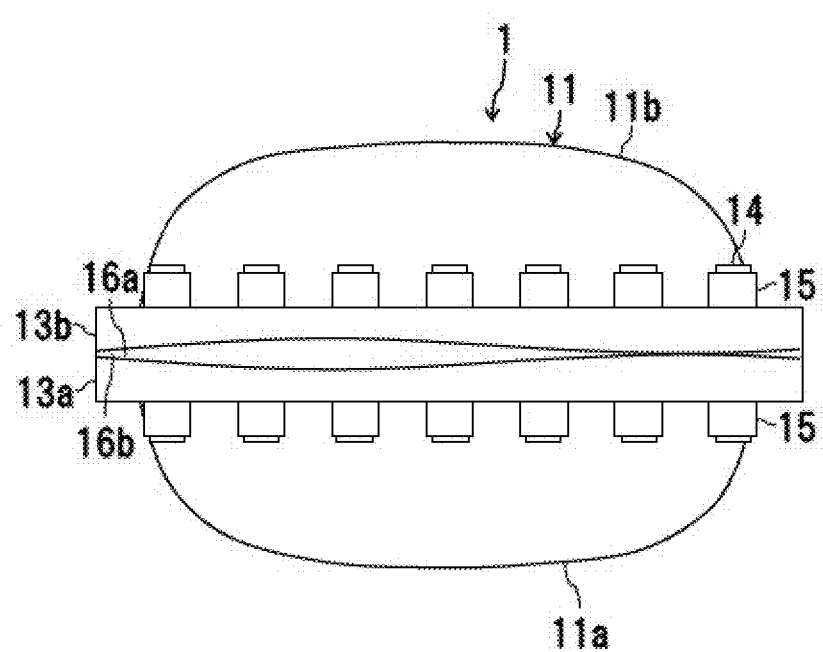
FIG. 12 is a schematic diagram illustrating a correction model of the turbine.

The model correction procedure is a procedure for reflecting the actual measurement information of the evaluated portion in the FE model and generating a correction model obtained through the correction of the FE model. The correction model corresponds to a model simulating the actually measured turbine (real turbine). As stated above, in the mesh 59 of the FE model, the inter-apex distance is set to be larger than the maximum assumed value of the movement amount of the evaluated portion. In the present embodiment, the evaluated portion is the flange surfaces 16a and 16b, so that the movement amount of the flange surfaces 16a and 16b due to the deformation of the casing 10 is within the range of the thickness of one layer of the mesh 59 as shown in FIG. 10. Taking this into consideration, there is made a correction in which data on solely the nodal points on the flange surfaces 16a and 16b of the mesh 59 of the evaluated portion of the FE model is adjusted to the actual measurement information. For example, in the FE model of the flange 13a of the outer casing lower half part 11a, the upper surface of the uppermost mesh 59 constitutes the flange surface 16a. Of these, when attention is paid to one mesh 59, as shown in FIG. 11, the mesh 59' of the correction model is of a configuration as obtained through cutting the upper portion of the mesh 59 of the FE model by the flange surface 16a (the two-dot chain line) of the actual measurement information. The flange surface of the actual measurement information is obtained by turning the three-dimensional scanning information of the flange surface 16a of the outer casing lower half part 11a into surface data. Thus, by solely changing the information on the coordinates (e.g., the z-coordinates) of the upper stage nodal points a through d of the eight nodal points (apexes) a through h of each mesh 59 of the evaluated surface of the FE model information, it is possible to prepare the correction model as shown in FIG. 12. In the example shown in FIG. 11, the nodal point a (x1, y1, z1) is corrected to the nodal point a' (x1, y1, z1'). Although the coordinate are not shown, a similar correction is executed on the nodal points b through d in preparing the correction model.

(Deformation Amount Estimating Procedure)

The deformation amount estimating procedure 57 is a procedure for estimating, through simulation using a correction model (bolt fastening analysis), the movement amount of the evaluated portion (the flange surfaces 16a and 16b in the present example) generated in the case where the upper half part and the lower half part of the casing 10 actually measured 10 are fastened by the bolts 14. In the simulation executed here, the process between the casing opening and the bolt fastening is reproduced by using the correction model prepared in the model correction procedure 56 to calculate the movement amount of the flange surfaces 16*a* and 16*b*. Further, based on this movement amount, it is also possible to calculate the position adjustment amount of the stationary body 20 with respect to the inner casing lower half part 12*a*.

(Output Procedure)

The output procedure 58 is a procedure for outputting (recording) the information on the correction model prepared by the model correction procedure 56, the estimated value of the movement amount of the evaluated portion calculated by the deformation amount estimation procedure 57, and the position adjustment amount of the stationary body 20 to the memories and for outputting them to the output device 48. The operator can check the movement amount of the evaluated portion of the correction model and the position adjustment amount of the stationary body 20, for example, through a monitor.

(Turbine Assembly Method)

Figure 13:
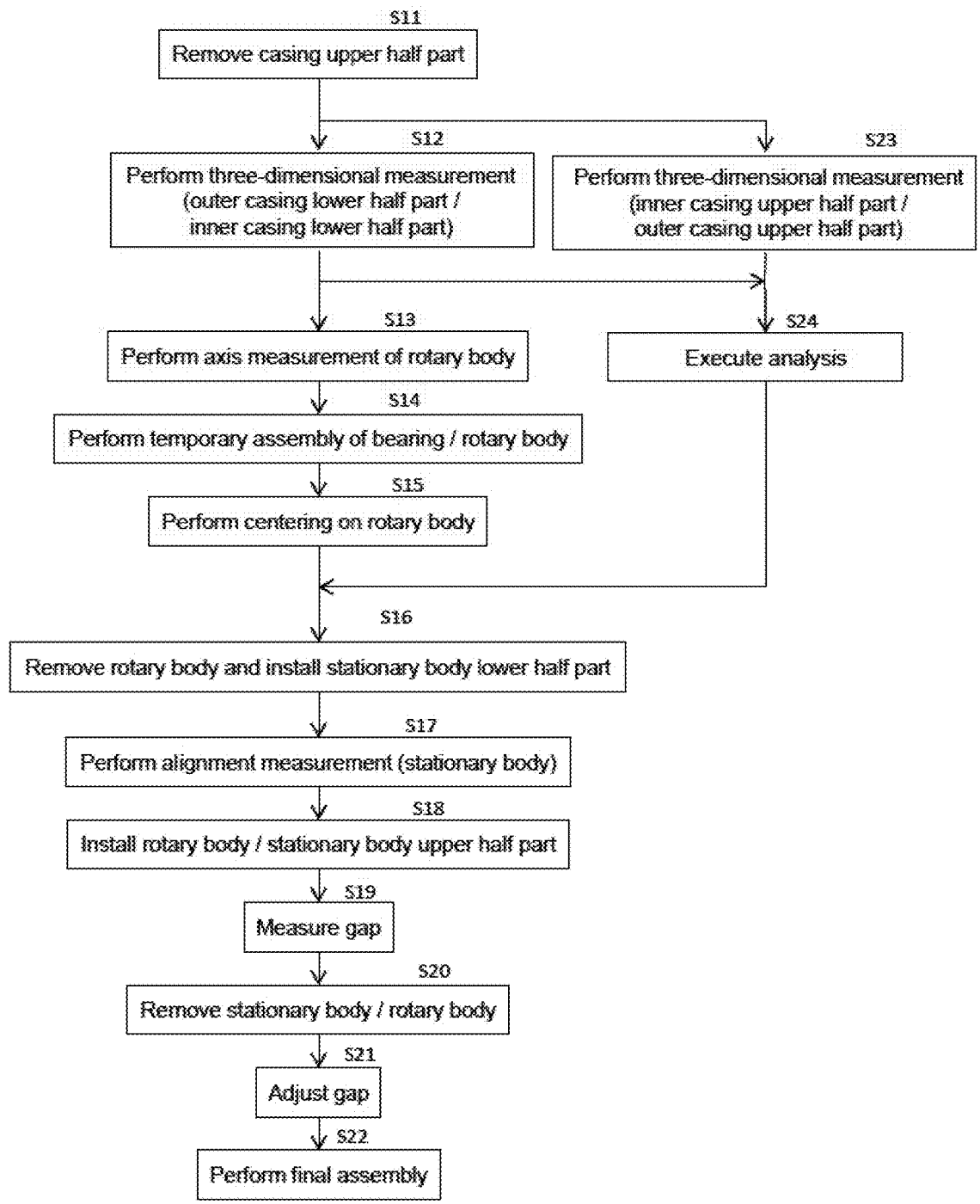
FIG. 13 is a flowchart illustrating the procedures of a turbine assembly method according to an embodiment of the present invention.

FIG. 13 is a flowchart illustrating the procedures of a turbine assembly method according to an embodiment of the present invention. In the present embodiment described here, a turbine that has operated for a fixed period of time is disassembled and assembled again by the operator as in the case of periodical inspection of the turbine. The following process, however, is also applicable to the assembly operation of newly producing the steam turbine 1 by omitting step S11 described below and actually measuring the three-dimensional configuration of the casing 10 at the time of production in steps S12 and S23. The turbine assembly method according to the present embodiment includes a mainstream process conducted at the installation position of the steam turbine 1, and a branch stream process conducted in a place other than that for the mainstream process. The mainstream process consists of steps S11 through S22. The branch stream process consists of steps S23 and S24 and can be executed in parallel with the mainstream process. In the following, the processes will be described.

(Mainstream Process)

Step S11

First, at the operation site of the steam turbine 1, the upper half part of the casing 10 is removed from the lower half part thereof, opening the outer casing 11 and the inner casing 12. More specifically, the bolts 14 and the nuts 15 are first removed, and the outer casing upper half part 11*b* is detached from the outer casing lower half part 11*a*. Next, the bolts and nuts (not shown) are removed, and the inner casing upper half part 12*b* is detached from the inner casing lower half part 12*a*. After this, the upper half part 20*b* of the stationary body 20, the rotary body 30, and the lower half part 20*a* of the stationary body 20 are successively removed from the lower half part of the casing 10. The lower half part of the casing 10 remains supported by the foundation 2, and the removed parts are temporarily put away in other places.

Step S12

In the subsequent step S12, there is gained actual measurement information on the three-dimensional configuration of the outer casing lower half part 11*a* and the inner casing lower half part 12*a* with the upper half parts removed. For the actual measurement of the three-dimensional configuration, it is possible to use, for example, a three-dimensional laser measurement device. In this case, the surface configuration of the outer casing lower half part 11*a* and the inner casing lower half part 12*a* is measured by the three-dimensional laser measurement device to gain point group data on the surface configuration. The point group data is an assembly of the space coordinates (X, Y, Z) of a large number of points. After removing noise, the point group data is turned into surface data (STL), and this is obtained as the actual measurement information of the three-dimensional configuration of the outer casing lower half part 11*a* and the inner casing lower half part 12*a*. By using a three-dimensional laser measurement device, it is possible to obtain accurate measurement results in a shorter time as compared with the case where the operator performs measurement using, for example, a level gauge.

There are cases where, for various reasons, it is difficult to remove the heat insulator on the outer peripheral surface of the outer casing lower half part 11*a* and the inner casing lower half part 12*a* and where it is difficult to measure the entire configuration of the outer casing lower half part 11*a* and the inner casing lower half part 12*a*. In this case, the configuration of the outer casing lower half part 11*a* and the inner casing lower half part 12*a* is measured within a possible range at least including the evaluated portion. Further, it is difficult to accurately measure the overall configuration of the casing 10 by solely scanning it once by a single three-dimensional measurement device. Thus, in measuring the overall configuration, it is more advantageous to perform scanning a plurality of times, varying the installation position of the three-dimensional laser measurement device with respect to the object of measurement. It should be noted, however, that, in some cases, the synthesis of the scanning data gained at each position does not progress successfully. Thus, it is more practical to adopt a measurement method in which a plurality of three-dimensional laser measurement devices are installed and in which their scanning operations are performed in conjunction with each other, or a flexible measurement method in which a portable three-dimensional measurement device is employed. In the case where the inner casing lower half part 12*a* is removed for the measurement, it is mounted to the outer casing lower half part 11*a*.

Steps S13 Through S17

After this, the measurement of the axis of the rotary body 30 (step S13), the temporary assembly of the bearing 33 and the rotary body 30 with respect to the foundation 2 (step S14), and the centering of the rotary body 30 (step S15) are successively executed. The rotary body 30 is removed from the bearing 33, and the lower half part 20*a* of the stationary body 20 is mounted to the inner casing lower half part 12*a* (step S16). Then, the alignment adjustment of the lower half part 20*a* of the stationary body 20 is executed (step S17). In step S17, based on the position adjustment amount obtained in the branch stream process, the installation position of the stationary body 20 with respect to the inner casing lower half part 12*a* is adjusted by a position adjustment member. More specifically, the installation position of the lower half part 20*a* of the stationary body 20 with respect to the inner casing lower half part 12*a* is adjusted in a direction opposite to the direction (usually upward) in which the casing 10 moves when the casing 10 is fastened by bolts in the final assembly (step S22). That is, in the case where the stationary body 20 rises with respect to the rotary body 30 through bolt fastening, the rising amount is taken into account, and the position of the stationary body 20 is previously lowered, whereby the center of the stationary body 20 and that of the rotary body 30 after the final assembly are matched with each other.

Steps S18 and S19

After this, the installation of the rotary body 30 with respect to the bearing 33 and the installation of the upper half part 20b with respect to the lower half part 20a of the stationary body 20 are successively executed (step S18), and the dimension of the gap between the stationary body 20 and the rotary body 30 is measured (step S19). The gap dimension between the stationary body 20 and the rotary body 30 can be checked by, for example, mounting the rotary body 30 with a lead wire previously extending along the inner peripheral portion of the stationary body 20, and measuring the thickness of the lead wire crushed between the stationary body 20 and the rotary body 30. While in the example described above the upper half part 20b of the stationary body 20 is mounted to the lower half part 20a at the time of the gap measurement, the mounting of the upper half part 20b of the stationary body 20 may be omitted if it is unnecessary in this process.

Steps S20 Through S22

After this, the upper half part 20b of the stationary body 20, the rotary body 30, and the lower half part 20a of the stationary body 20 are successively removed (step S20), and fine adjustment is performed on the gap dimension between the stationary body 20 and the rotary body 30 based on the measurement result in step S19 (step S21). The fine adjustment of the gap dimension between the stationary body 20 and the rotary body 30 is effected through the adjustment of the height, for example, of the seal (e.g., seal fin) between the stationary body 20 and the rotary body 30. Finally, the final assembly of the steam turbine 1 is executed in step S22. That is, bolt fastening is effected while successively installing the lower half part 20a of the stationary body 20, the rotary body 30, the upper half part 20b of the stationary body 20, the inner casing upper half part 12b, and the outer casing upper half part 11b.

(Branch Stream Process)

First, in step S23, there is gained the actual measurement information on the three-dimensional configuration of the outer casing upper half part 11b and the inner casing upper half part 12b removed from the lower half parts. The method of actually measuring the three-dimensional configuration is the same as that described in connection with step S12. In the subsequent step S24, analysis is executed by using the turbine assembly support system described above, and there is derived the estimated value of the movement amount of the evaluated portion generated in the case where the upper half part and the lower half part (i.e., the real thing) of the casing 10 measured through three-dimensional measurement are bolt-fastened. The processing executed in this procedure is the same as that described above in connection with the turbine assembly support program. That is, the previously prepared FE model is corrected by the actual measurement information on the casing 10 obtained in steps S12 and S23, and bolt fastening simulation is executed by using the correction model. As a result, the movement amount of the evaluated portion in the final assembly step (step S22) is estimated, and the adjustment amount of the stationary body 20 at the installation position can be derived. As described above, the adjustment amount of the stationary body 20 at the installation position obtained here is utilized in the process of step S16.

(Conventional Turbine Assembly Method)

Figure 14:
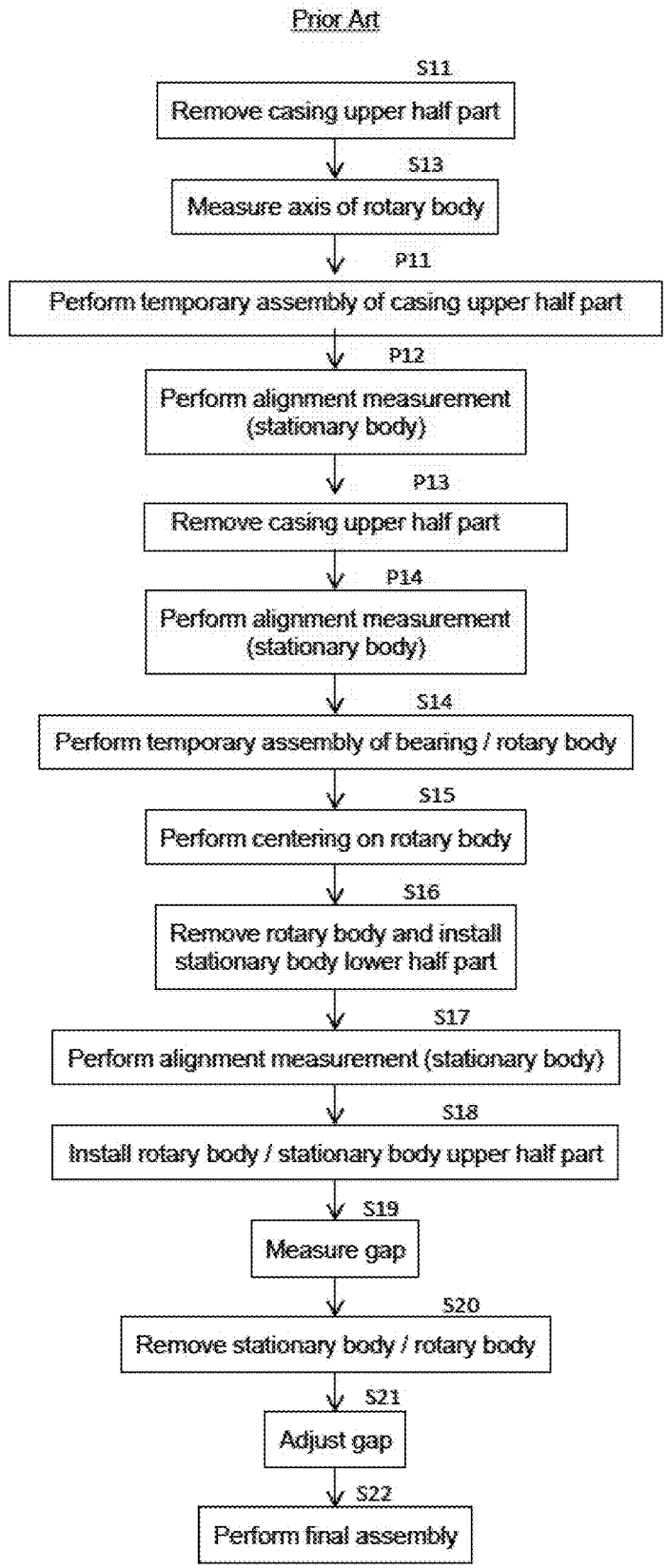
FIG. 14 is a flowchart illustrating the procedures of a conventional turbine assembly method.

FIG. 14 is a flowchart illustrating the procedures of a conventional assembly method. The conventional assembly procedures consist of steps S11, S13, P11 through P14, and S14 through S22. All of these processes are conducted at the turbine installation position. Steps S11 and S13 through S22 are processes corresponding to the steps of FIG. 13 indicated by the same reference signs. The difference from the procedures of FIG. 13 is that there are no procedures of steps S12, S23, and S24. Instead, there exist the procedures of steps P11 through P14 between the procedures of steps S13 and S14. In the following, steps P11 through P14 will be briefly described.

Conventionally, before mounting the rotary body after the measurement of the axis of the removed rotary body, the stationary body, the inner casing, and the outer casing are temporarily assembled in the state in which the rotary body is absent, thus simulating the turbine assembly state (step P11). In the process, the lower half part and the upper half part are fastened together by bolts with respect to each of the stationary body, the inner casing, and the outer casing as in the case of the final assembly. After this, alignment adjustment measurement for the stationary body is executed (step P12). For example, between the bearings, there is formed an imaginary axis by a piano wire or laser so as to coincide with the axis of the rotary body, and the distance between the imaginary axis and the evaluation point of the stationary body is measured by a micrometer, a laser measurement device or the like. Typically, the evaluation point of the stationary body is at the right and left side portions of the inner peripheral surface of the stationary body and the lower side portion thereof. Through the measurement of this process, it is possible to estimate the position of the stationary body after the final assembly in the actual condition.

Next, the inner casing and the outer casing are opened (step P13), and alignment adjustment measurement of the stationary body is executed with the stationary body mounted to the inner casing lower half part. Then, the stationary body is removed (step P14). The measurement method is the same as that in step P12. Through this measurement, it is possible to know the position of the stationary body in the state in which the upper half part of the casing is removed. The difference between the position of the stationary body obtained in step P12 and that obtained in step P14 is estimated as the displacement amount of the stationary body before and after the bolt-fastening of the casing.

(Effects of the Invention)

(1) As stated above, the conventional turbine assembly procedures include the temporary casing assembly process so that the displacement amount of the stationary body due to the bolt fastening may be known. The temporary casing assembly process involves bolt fastening similar to the final assembly process, that is, it involves performing thermal shrinking which takes time to heat and cool the bolts. Due to the large number of bolts, this requires a lot of time. In contrast, according to the present embodiment, it is possible to accurately estimate the deformation amount of the evaluated portion greatly influencing the displacement of the stationary body through analysis using a correction model reflecting the actual measurement information of the actual turbine, so that it is possible to omit the processes accompanying the temporary assembly of the casing (steps P11 through P14 of FIG. 14). It is true that there are additional steps S12, S23, and S24. The requisite time for the process of step S12, however, is considerably short as compared with the requisite time for the conventional steps P11 through P14. Further, the processes of steps S23 and S24 can be executed in parallel with the mainstream processes. Thus, it is possible to shorten the term of work by the difference between the requisite time for the steps P11 through P14 and the requisite time for the step S12. Further, it is possible to accurately estimate the displacement amount of the stationary body through simulation, so that it is possible to assemble the turbine with high accuracy.

(2) As described above, in the present embodiment, the data on the mesh alone 59 of the evaluated portion in the previously prepared FE model of the turbine is corrected in accordance with the actual measurement information, thereby preparing a correction model simulating the actually measured turbine. As a result, it is possible to suppress the computation amount required for the preparation of the correction model. Each mesh 59 is a solid object one side of which is larger than the maximum value of the deformation amount of the assumed evaluated portion, which also helps to contribute to the suppression of the computation amount. Thus, it is possible to suppress the requisite time for the model correction procedure 56 and the deformation amount estimation procedure 57 of FIG. 6, making it possible to execute the analysis execution process (step S24) in a short period of time. If the branch stream process requires an excessive amount of time, there is the possibility of the benefit of the effect of the reduction in the work term of the mainstream process not being sufficiently enjoyed. In the present embodiment, it is possible to eliminate or suppress the influence of the work term of the branch stream process on the progress of the mainstream process.

In the relationship with the mainstream process, however, it does not greatly affect the attaining of the basic effect (1) if the requisite time for the model correction procedure 56 increases more or less. Thus, instead of the method described with reference to FIGS. 9 through 11, it is possible to apply some other method to the model correction procedure 56. For example, it is possible to deform the mesh of the FE model by a morphing tool based on the actual measurement information to prepare the correction model. In this case also, by restricting to the correction to the evaluated portion alone, the computation amount is suppressed, and the requisite time is suppressed. Further, it may be possible to prepare the correction model through element division of the actual measurement information of the evaluated portion as turned into data or the actual measurement information as reflected in the turbine design data (three-dimensional CAD data).

What is claimed is:

1. A computer-implemented method of causing a computer to execute a turbine assembly support program supporting assembly of a turbine including: a casing having an upper half part and a lower half part fastened together by bolts; a stationary body including a plurality of stator vanes, accommodated in the casing, and of a vertically divided structure supported by the lower half part; and a rotary body including a plurality of rotor blades and supported by a plurality of bearings so as to be situated on an inner side of the stationary body, the method comprising:
   a first step of reading a finite element model of a three-dimensional configuration of the turbine;
   a second step of reading an actual measurement information on a three-dimensional configuration of the upper half part and the lower half part of the casing in an open state;
   a third step of based on the actual measurement information of the casting, reflecting an actual measurement information of an evaluated portion that is a specific part of the casing in the finite element model and generating a correction model obtained through correction of the finite element model;
   a fourth step of estimating a movement amount of the evaluated portion, through simulation using the correction model in order to omit any temporary assembly process to fasten the upper half part and the lower half part of the casing by the bolts, the movement amount being generated when the upper half part and the lower half part of the casing are fastened together by the bolts;
   a fifth step of calculating a position adjustment amount of the stationary body with respect to the lower half part based on the estimated value of the movement amount; and
   a sixth step of outputting the estimated value of the movement amount or the position adjustment amount of the stationary body to an output device.

2. The method according to claim 1, wherein the evaluated portion is a mutual flange surface of the upper half part and the lower half part of the casing.

3. The method according to claim 2, wherein the finite element model includes a plurality of meshes one side of each of which is set to be larger than a maximum assumed value of the movement amount of the evaluated portion.

4. The method according to claim 3, wherein the correction model is prepared by changing a configuration of the meshes alone intersecting the flange surface actually measured to a configuration cut by the flange surface.

5. The method according to claim 1, wherein the method further causes the computer to execute an analysis condition setting procedure that is a procedure of previously setting an analysis condition prior to an assembly of the turbine on the site.

6. The method according to claim 5, wherein the analysis condition setting procedure includes:
   an evaluated portion extraction procedure;
   a finite element data preparation procedure; and
   a second output procedure.

7. A turbine assembly support system comprising: at least one memory;
   a finite element model;
   an actual measurement information, and information on an evaluated portion; and
   a CPU reading and executing a turbine assembly support program, wherein the at least one memory stores the turbine assembly support program supporting assembly of a turbine including: a casing having an upper half part and a lower half part fastened together by bolts; a stationary body including a plurality of stator vanes, accommodated in the casing, and of a vertically divided structure supported by the lower half part; and a rotary body including a plurality of rotor blades and supported by a plurality of bearings so as to be situated on an inner side of the stationary body, the turbine assembly support program when executed causes the CPU to carry out:
   a first step of reading the finite element model of a three-dimensional configuration of the turbine;
   a second step of reading the actual measurement information on a three-dimensional configuration of the upper half part and the lower half part of the casing in an open state;
   a third step of based on the actual measurement information of the casing, reflecting the actual measurement information of the evaluated portion that is a specific part of the casing in the finite element model and generating a correction model obtained through correction of the finite element model;
   a fourth step of estimating a movement amount of the evaluated portion through simulation using the correction model in order to omit any temporary assembly process to fasten the upper half part and the lower half part of the casing by the bolts, the movement amount being generated when the upper half part and the lower half part of the casing are fastened together by the bolts;

a fifth step of calculating a position adjustment amount of the stationary body with respect to the lower half part based on the estimated value of the movement amount; and a sixth step of outputting the estimated value of the movement amount or the position adjustment amount of the stationary body to an output device.

8. A method of assembling a turbine including: a casing having an upper half part and a lower half part fastened together by bolts; a stationary body including a plurality of stator vanes, accommodated in the casing, and of a vertically divided structure supported by the lower half part; and a rotary body including a plurality of rotor blades and supported by a plurality of bearings so as to be situated on an inner side of the stationary body, the method comprising:

a first step of actually measuring a three-dimensional configuration of the upper half part and the lower half part of the casing in an open state;

a second step of based on the actual measurement information of the casing, reflecting actual measurement information of an evaluated portion that is a specific part of the casing in a finite element model of the turbine and generating a correction model obtained through correction of the finite element model;

a third step estimating a movement amount of the evaluated portion through simulation using the correction model in order to omit any temporary assembly process to fasten the upper half part and the lower half part of the casing by the bolts, the movement amount being generated when the upper half part and the lower half part of the casing are fastened together by the bolts;

a fourth step of installing a lower half part of the stationary body in the lower half part of the casing and adjusting a position of the lower half part of the stationary body based on an estimated value of the movement amount; and a fifth step of successively mounting the rotary body, an upper half part of the stationary body, and the upper half part of the casing.

* * * * *